United States Patent [19]
Gardner et al.

[11] Patent Number: 5,795,809
[45] Date of Patent: Aug. 18, 1998

[54] SEMICONDUCTOR WAFER FABRICATION PROCESS INCLUDING GETTERING UTILIZING A COMBINED OXIDATION TECHNIQUE

[75] Inventors: Mark I. Gardner, Cedar Creek; H. Jim Fulford, Jr.; Said N. Ghneim, both of Austin, all of Tex.

[73] Assignee: Advanced Micro Devices, Inc., Sunnyvale, Calif.

[21] Appl. No.: 450,021

[22] Filed: May 25, 1995

[51] Int. Cl.$^6$ ............................................. H01L 21/76
[52] U.S. Cl. .................... 438/402; 438/439; 438/471
[58] Field of Search .......................... 437/10, 11, 69, 437/70, 924; 148/DIG. 50, DIG. 102; 257/797; 438/439, 402, 471

[56] References Cited

U.S. PATENT DOCUMENTS

| | | |
|---|---|---|
| 4,661,166 | 4/1987 | Hirao . |
| 5,010,034 | 4/1991 | Manoliu . |
| 5,242,854 | 9/1993 | Sulheim et al. . |
| 5,316,966 | 5/1994 | Van Der Plas et al. . |
| 5,445,975 | 8/1995 | Gardner et al. . |
| 5,470,783 | 11/1995 | Chiu et al. . |

FOREIGN PATENT DOCUMENTS

| | | |
|---|---|---|
| 55-68650 | 5/1980 | Japan . |
| 56-118366 | 9/1981 | Japan . |
| 59-103335 | 6/1984 | Japan . |

OTHER PUBLICATIONS

Wolf, et al., "Silicon Processing for the VLSI Era," vol. 2, pp. 428–431.

Wolf, et al., "Silicon Processing for the VLSI Era," vol. 2, pp. 327–337.

*Primary Examiner*—George R. Fourson
*Attorney, Agent, or Firm*—Kevin L. Daffer; Conley, Rose & Tayon

[57] ABSTRACT

An improved method of silicon wafer fabrication suitable for either CMOS and/or NMOS process flows. The present method utilizes few processing steps to reduce fabrication costs and enhance wafer throughput. The improved method combines sacrificial oxide growth and removal steps of CMOS and NMOS front end pre-oxide steps with existing pad oxide growth and removal steps, resulting in fewer required operations. The thermal cycles required to form gettering sites within Cz bulk silicon wafers are retained, thus allowing the number of required processing operations to be reduced without negatively impacting existing levels of expected production yields.

10 Claims, 3 Drawing Sheets

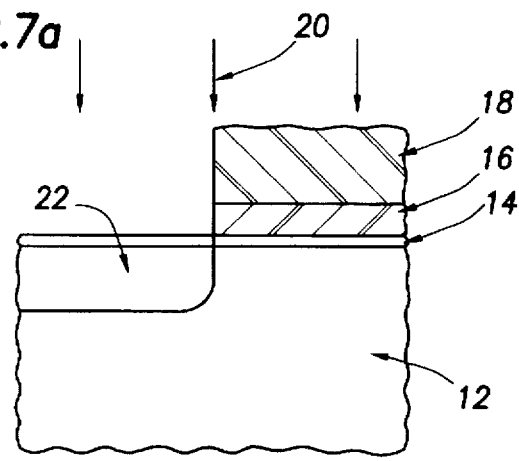
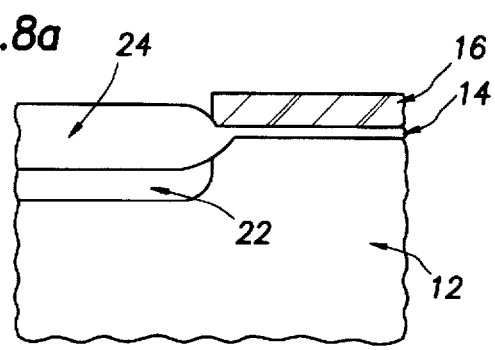
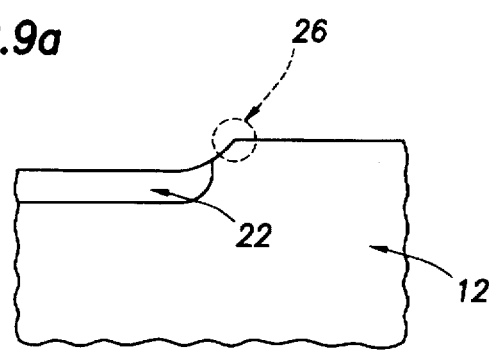
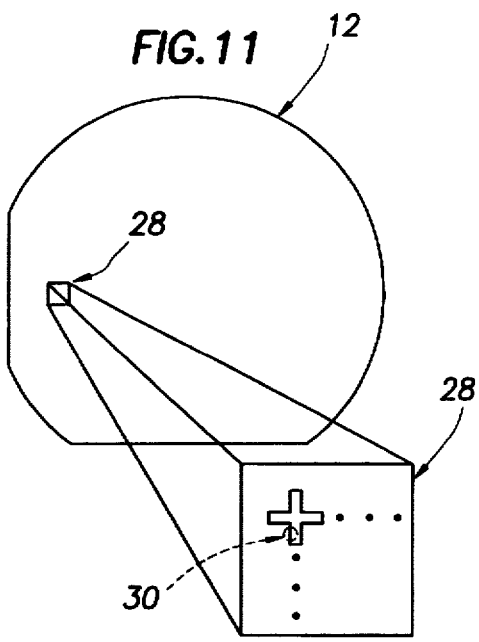
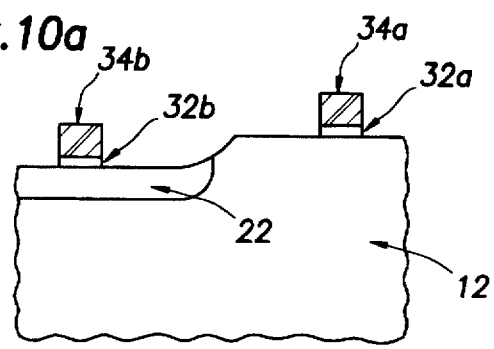
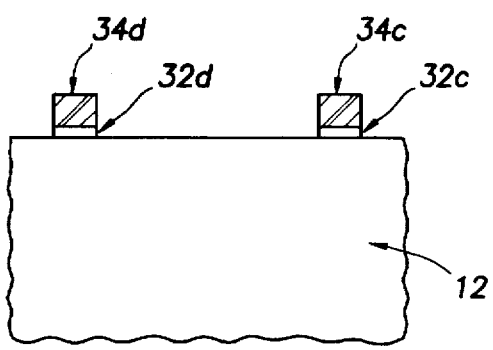

SEMICONDUCTOR WAFER FABRICATION PROCESS INCLUDING GETTERING UTILIZING A COMBINED OXIDATION TECHNIQUE

BACKGROUND OF THE INVENTION

1. Field of the Invention

This invention relates to the fabrication of an integrated circuit and more particularly to an MOS fabrication process having minimal pre-oxidation fabrication steps to achieve enhanced gettering capability.

2. Description of the Relevant Art

Wafer fabrication involves a series of processes used to create electronic devices in and on the surface of a monolithic crystalline semiconductor wafer (i.e., substrate). The basic processes involved in wafer fabrication include cleaning, layering (or deposition), patterning, and doping. As competition in the semiconductor manufacturing area increases, more emphasis is being placed on finding ways to cut costs and increase production throughput and yields.

Device performances and production yields are dependent on the level of defects in a semiconductor wafer. As used herein, the term defect refers to any non-uniform material or structure present within a monolithic crystalline substrate which may negatively impact device performance. Exemplary defects may arise from ingress of electrically active metal contaminants such as copper (Cu) and iron (Fe) into the substrate. Other defects involve structural defects within the crystalline lattice structure. Structural defects include point defects such as vacancies, line defects such as dislocation loops, and area defects such as stacking faults. Among the most important device and substrate properties relevant to complementary metal oxide semiconductor (CMOS) devices and influenced by crystalline lattice defects include leakage currents at the well-to-bulk material juncture (i.e., in the well p-n junctions). Further deleterious results of crystalline lattice defects include reduced minority carrier lifetimes, gate-oxide quality degregation, and threshold voltage nonuniformity.

The surface and near-surface regions of a semiconductor wafer may contain defects as a result of operations used in the production of the wafer. Semiconductor wafers are initiated by slicing an ingot of monolithic crystalline silicon into wafers. Wafer production operations which may result in surface defects include wafer slice and polish operations. A semiconductor wafer may also be damaged or contaminated during subsequent packaging and shipping operations, also resulting in wafer defects. Since device performances and production yields are dependent on the level of defects in a semiconductor wafer, it is necessary to begin wafer fabrication with wafers which are as clean and defect free as possible.

A single-well CMOS process may be implemented in either p-well or n-well technology. In CMOS n-well technology, n-type MOS (NMOS) devices are formed in a lightly doped p-substrate, while the p-type MOS (PMOS) devices are formed in a more heavily doped n-well. CMOS technology thereby involves a well formation prior to the fabrication of devices therein. If only NMOS devices are to be formed on a monolithic circuit (i.e., one not involving p-type devices), the NMOS devices are fabricated within the starting bulk p-type substrate without forming an intervening well. A CMOS process will first be described hereinbelow, followed by a description of an NMOS process.

The first step in a CMOS wafer fabrication process is typically a wafer cleaning procedure. A common wafer cleaning procedure uses a technique known as the RCA method. Although there have been many adaptations, an RCA cleaning process involves the use of hydrogen peroxide as an oxidant along with an acid or base to remove organic film and inorganic ion and heavy metal contaminants.

A second step in a CMOS process is generally a pre-process growth of sacrificial silicon dioxide (often called "pre-oxide") layer on the exterior surface of the cleaned silicon substrate. FIG. 1 shows a thermally-grown oxide layer 10 on the upper surface of a silicon substrate 12. As an oxide layer grows on a silicon substrate, silicon atoms at the surface of the silicon substrate are consumed, and the oxide-silicon interface moves into the silicon substrate. Defects on and just under the surface of silicon substrate 12 may thus be removed during the oxide growth process. When the oxide is removed, the result is a "cleaner" and more defect-free surface of silicon substrate 12. FIG. 2 shows silicon substrate 12 after removal of thermally grown oxide layer 10.

If silicon substrate 12 is a bulk silicon wafer manufactured using the Czochralski (Cz) method, the pre-process oxide growth may be carried out at a temperature of between 1000° C. and 1150° C., and may also serve as a high-temperature oxygen denudation step in a Cz bulk silicon wafer intrinsic gettering process. A denudation procedure is the first step in the formation of lattice dislocations (gettering sites) in a silicon substrate beneath the surface region where electronic devices will be formed. As the Cz silicon wafer is heated during the thermal oxidation process, oxygen (commonly found in abundance in Cz silicon wafers) rapidly diffuses in many directions, one of which is from the surface and into the wafer bulk. Subsequent cooling of the wafer may cause the diffused interstitial oxygen in the wafer bulk to homogeneously nucleate into small clusters, many of which may be found at the implant depth. A heating step following the cooling of the silicon wafer may result in many of these small oxygen clusters growing into precipitates large enough to form desired lattice dislocations (gettering sites) in the wafer bulk at the implant depth. These gettering sites trap unwanted impurities which, if located in the active regions near the surface of the wafer, would lower device performance and yield.

The formation of gettering sites occur below the active regions where electronic devices are to be formed. The gettering sites serve to trap unwanted impurities which might otherwise find their way into the overlying active regions. Thus, under the right conditions, the growth of a sacrificial oxide on the exterior surfaces of a Cz bulk silicon wafer results in a "cleaner" and more defect free zone from the surface of the wafer to a depth beneath the active regions. A semiconductor wafer with these characteristics is highly desirable for the manufacture of advanced CMOS integrated circuits with submicron device dimensions.

CMOS and NMOS wafer fabrication processes both involve a long series of required operations. Eliminating one or more of these required operations or combining two or more of these required operations together would result in fewer required operations. Fewer required operations in a wafer fabrication process logically results in a decrease in the amount of time and effort required to process wafer lots, thus decreasing costs incurred and increasing manufacturing throughput. It would thus be desirable to eliminate or combine together as many required operations as possible in forming a CMOS device, or in forming a NMOS device, regardless of whether the NMOS device is fabricated with or separate from the CMOS device. It would further be desirable to eliminate processing steps without jeopardizing manufacturing yields or device longevity.

Accordingly, it would be desirable to eliminate the pre-oxide step and the removal of the pre-oxide. Removal of the pre-oxide formation and subsequent removal thereof can save processing time and enhance throughput. Moreover, elimination of pre-oxide growth can eliminate the necessity of a thermal furnace normally used to thermally grow the pre-oxide. Further, avoiding having to remove the pre-oxide eliminates the plasma or wet etchant necessary for that process.

SUMMARY OF THE INVENTION

An improved integrated circuit fabrication process is provided which uses fewer required process steps. The improved method combines sacrificial pre-oxide growth and removal steps associated with the front end process sequence of a CMOS wafer or an NMOS wafer. That is, the present method combines the step of growing sacrificial oxide with that of growing pad oxide. Combining these two steps into a single step not only eliminates the necessity for removing the sacrificial oxide (i.e., the oxide no longer being sacrificial prior to pad oxide formation), but also results in fewer required operations. A wafer fabrication process with fewer required operations logically achieves a decrease in the amount of time and effort required to process wafer lots, thus decreasing costs incurred and increasing manufacturing throughput. Importantly, the thermal cycles required to form gettering sites within Cz bulk silicon wafers are retained, thus allowing the number of required processing operations to be reduced without negatively impacting existing levels of expected production yields.

Broadly speaking, the present invention contemplates a method for producing a semiconductor topography with minimal oxidation steps. The method includes the steps of providing a single crystal silicon material having an exposed surface. A pad oxide is then grown upon the exposed surface after the exposed surface is subjected to a cleaning solution. Thereafter, a nitride film is deposited upon the oxide, and the nitride film and underlying pad oxide is patterned to present an opening to the exposed surface. A sacrificial oxide is then grown upon the exposed surface within the confines of the opening and thereafter removed to present an elevation recess about the lateral periphery of the opening. The elevation recess is used to align a mask subsequently placed in proximity with the exposed surface.

The present invention further contemplates a method for producing a semiconductor topography with minimal oxidation steps. The method includes the steps of providing a single crystal ingot sliced into a plurality of wafers, each wafer having a substantially planar surface. Without purposefully subjecting the planar surface to substantial amounts of oxidizing ambient, the planar surface is placed into a cleaning solution subsequent to the preceding step. The pad oxide is then grown between 250 to 400 angstroms in thickness upon the planar surface immediately after the planar surface is cleaned. A second nitride film is then deposited upon the second pad oxide and thereafter is patterned such that the nitride film and underlying pad oxide is selectively removed to present an opening to the planar surface. A field oxide is then grown upon the planar surface within the confines of the opening. The remaining nitride film is then removed to allow an active region to be implanted with a dopant through the remaining pad oxide into the planar surface in a region absent the field oxide.

BRIEF DESCRIPTION OF THE DRAWINGS

Other objects and advantages of the invention will become apparent upon reading the following detailed description and upon reference to the accompanying drawings in which:

FIG. 7a is a cross-sectional view of the silicon substrate processed subsequent to FIG. 4 having a photoresist layer, underlying nitride and pad oxide layer selectively removed to present an exposed substrate surface for receive a well implant;

FIG. 7b is a cross-sectional view of the silicon substrate processed subsequent to FIG. 6 having portions of nitride and pad oxide layers remaining over active areas within the substrate;

FIG. 8a is a cross-sectional view of the silicon substrate processed subsequent to FIG. 7a, having a sacrificial oxide formed upon the exposed substrate overlying the n-well implant region;

FIG. 9a is a cross-sectional view of the silicon substrate at the lateral periphery of the well implant regions after removal of the sacrificial oxide to produce an elevational step at said periphery;

FIG. 10a is a cross-sectional view of the silicon substrate with nitride and pad oxide layers patterned such that they remain over active areas in which active devices (transistors, etc.) are to be formed; and FIG. 11 is a cross-sectional view of one embodiment of an alignment mark in a test die area of a silicon substrate.

Figure 1:
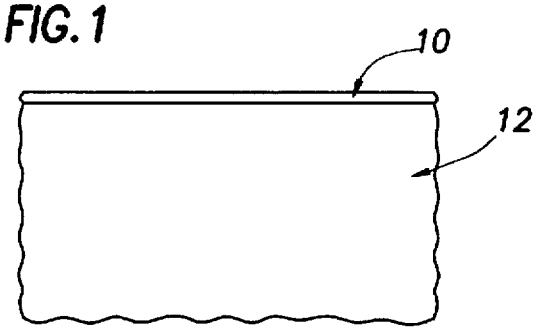
FIG. 1 is a cross-sectional view of a thermally grown sacrificial oxide layer placed on the upper surface of a silicon substrate according to the conventional pre-oxide methodology.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Figure 3:
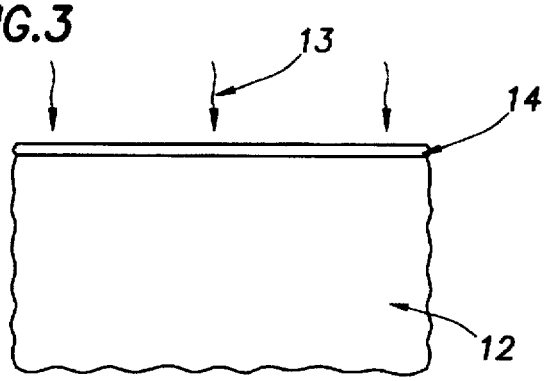
FIG. 3 is a cross-sectional view of the silicon substrate with a pad oxide layer formed according to a CMOS process flow of the present invention in lieu of the sacrificial oxide of FIG. 1.

A CMOS process entails the formation of well regions, such as an n-well region within a p-type substrate. The nwell can be formed by a masking layer. If an oxide-nitride (or nitride) masking layer is used, a CMOS wafer is fabricated by growing a pad oxide upon the substrate upper surface prior to nitride deposition. FIG. 3 shows a pad oxide layer 14 formed on silicon substrate 12. Thermal energy 13 is used to grow pad oxide layer 14. As will be described in further detail hereinbelow, pad oxide layer 14 is grown in lieu of any previous oxidation steps. Pad oxide layer 14 is therefore the first layer grown upon substrate 12, in the absence of any sacrificial, pre-oxide layers of conventional art. Instead of being grown, pad oxide layer can alternatively be deposited using a chemical vapor deposition (CVD) process. The function of pad oxide layer 14 is to cushion the transition of stresses between silicon substrate 12 and a nitride layer to be deposited upon pad oxide layer 14.

Figure 4:
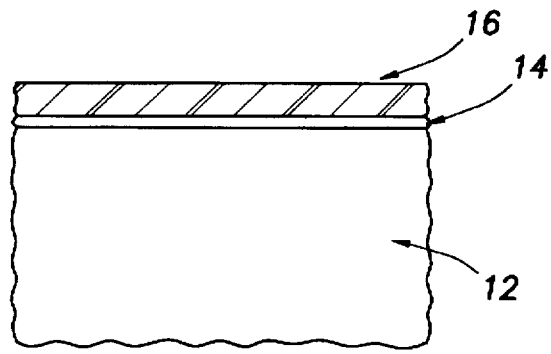
FIG. 4 is a cross-sectional view of the silicon substrate with a nitride layer placed upon the pad oxide layer of FIG. 3.

After pad oxide layer 14 is grown on a silicon substrate, a masking layer such as nitride is deposited over the pad oxide layer. FIG. 4 shows silicon substrate 12 with pad oxide layer 14 and a nitride layer 16. The function of nitride layer 16 is to inhibit further oxidation of the underlying silicon during a subsequent oxidizing step. Oxygen and water vapor diffuse very slowly through silicon nitride, thus nitride layer 16 prevents oxidizing species from reaching the portion of silicon substrate 12 under nitride layer 16. Nitride layer 16 may be deposited using a CVD process.

The deposition of nitride layer 16 over pad oxide 14 may be carried out at a temperature of about 780° C., and may also serve as the reduced-temperature oxygen nucleation step in the Cz bulk silicon wafer intrinsic gettering process described above.

After nitride layer 16 is deposited over pad oxide layer 14, the next step in a CMOS process may be to mask and etch the pad oxide and nitride layers to form windows which will define the well regions. A layer of photoresist may be applied to the surface of the entire silicon substrate and patterned using optical lithography techniques. The nitride layer may then be dry etched, and the pad oxide may be removed using either a wet or dry chemical etch process. The photoresist is typically left in place to serve as an additional masking layer for the following impurity implant step.

After the n-well regions are defined and the pad oxide-nitride layer etched, the well implants may be formed. Dopant impurities are introduced into a silicon substrate by chemical diffusion or ion implantation. In a CMOS n-well process, a n- implant of arsenic or phosphorus is typically used. FIG. 7a shows silicon substrate 12 with etched pad oxide layer 14, nitride layer 16, photoresist layer 18, and incident dopant atoms 20 forming an n-well implant 22. After n-well implant 22 has been formed, photoresist layer 18 is then removed. Silicon substrate 12 may then be subjected to a high temperature drive-in (following chemical diffusion doping) or anneal (following ion implantation).

The drive-in or anneal of n-well implant 22 may be carried out at a temperature of about 1050° C., which may also serve as the high-temperature oxygen precipitation step in the Cz bulk silicon wafer intrinsic gettering process described above.

After n-well implants are formed, steps in the topography of the surface of the wafer may be created to serve as alignment marks for future lithographic processes. In order to form these alignment marks (or elevational steps), a thick oxide layer is grown over the n-well regions. The thick oxide layer may be grown by means of wet oxidation (at an elevated temperature and in an atmosphere containing water vapor). As mentioned above, an oxide layer consumes silicon atoms at the surface of a silicon substrate as it grows. Thus the oxide-silicon interface moves into the silicon substrate as the oxide layer grows. The thick oxide layer grows where there is no masking nitride, and may merge into the exposed edges of the pad oxide layer. FIG. 8a shows silicon substrate 12, pad oxide layer 14 merged with thick oxide layer 24, nitride layer 16, and n-well implant 22.

After thick oxide layer 24 is grown over the n-well regions, thick oxide layer 24 may then be etched away (thereby indicating that oxide layer 24 is a sacrificial oxide) using a wet or dry chemical process. The remaining nitride layer 16 may thereafter be dry etched, and underlying pad oxide layer 14 is subsequently removed using a wet or dry chemical etch process. FIG. 9a shows an alignment mark (step) 26 formed in the surface topography of silicon substrate 12 by the growth and removal of thick oxide layer 24.

An alignment mark is created by the elevational step height at the outer periphery of the well region. The alignment mark can be formed on any non used area of the semiconductor wafer, a suitable area involves a test die area formed at various locations about the wafer. Test die areas typically contain special devices and circuit elements that can be electrically tested during the wafer fabrication process. The layer of photoresist applied to the entire surface of the wafer during the previous n-well definition process may be patterned to leave a window in the photoresist over the alignment mark area. The nitride layer over the alignment mark area may then be removed during the subsequent dry etch step, and the pad oxide over the alignment mark area may be removed during the wet or dry chemical etch process. A thick oxide layer may also be grown over the alignment mark area at the same time the thick oxide layer is grown over the n-well regions. The thick oxide over the alignment mark area may then be removed when the thick oxide layer over the n-well regions is removed. A step will thus be created in the surface of the silicon substrate around the periphery of the alignment mark, which purposefully coincides with the step created at the periphery of the well regions. FIG. 11 shows one embodiment of an alignment mark 30 in test die area 28 of wafer silicon substrate 12.

In order to isolate metal oxide semiconductor (MOS) devices formed in and on a silicon substrate, it is necessary to prevent the formation of conductive channels in the field regions between transistors. One common technique to ensure isolation of MOS devices is the local oxidation of silicon (LOCOS) approach. Using LOCOS, device active regions are separated by isolating regions of thick field oxide. The step coverage limitation of a grow-oxide-and-etch approach to LOCOS is reduced with a semirecessed-oxide LOCOS process which results in a more planar upper surface. In the semirecessed-oxide LOCOS process, active regions are first covered with a thin layer of silicon nitride that prevents oxidation of silicon beneath it. The field regions between active regions may then doped with a channel-stop implant. A thick field oxide is typically grown over the field regions. Active regions are then exposed by removing the patterned silicon nitride residing between thick field oxide areas.

After alignment marks are formed, standard LOCOS-based CMOS processing may continue. A pad oxide layer may be grown over the active regions to cushion the transition of stresses between the silicon substrate and the nitride layer to be deposited next. The pad oxide layer may be thermally grown or deposited using a chemical vapor deposition (CVD) process. A nitride layer may then be deposited over the pad oxide layer to inhibit further oxidation of the underlying silicon during a following oxidizing step. The nitride layer may be deposited using a CVD process.

The next step in a CMOS process may be to mask and etch the pad oxide and overlying nitride layer to form windows which will define the regions. A layer of photoresist is used to pattern the nitride and pad oxide. After selectively exposing the photoresist, select portions of photoresist are removed to expose portions of the nitride. The exposed nitride layer may then be dry etched, and the pad oxide removed using a wet or dry chemical etch process. FIG. 10a shows silicon substrate 12 with n-well implant 22 and nitride layers 34a and 34b on pad oxide layers 32a and 32b, respectively.

The next step in a CMOS process may be to remove the pad oxide-nitride layers covering the active regions. A nitride layer over a pad oxide layer may be dry etched, and the underlying pad oxide layer may be removed using a wet or dry chemical etch process. FIG. 10a applies to a CMOS n-well process. Nitride layers 34a and 34b over pad oxide layers 32a and 32b may be dry etched, and the underlying pad oxide layers 32a and 32b may be removed using a wet or dry chemical etch process.

The remaining CMOS process sequence is well understood by those skilled in the art and generally includes gate oxide growth, polysilicon gate definition, source/drain formation, metallization, passivation, etc. See, e.g., Wolf, et al., "Silicon Processing for the VLSI Era," Vol. 2, pp. 428–431 (incorporated herein by reference).

As mentioned above, a CMOS wafer can include NMOS devices fabricated upon a single wafer and within the same fabrication run. Alternatively, CMOS wafers can be manufactured separate from NMOS wafers. The first step in an NMOS wafer fabrication process may be a wafer cleaning procedure employing the RCA method. A second step in a silicon NMOS wafer fabrication process may be a pre-process growth of a sacrificial oxide layer. FIG. 1 shows thermally-grown oxide layer 10 on the exterior surface of silicon substrate 12.

Figure 2:
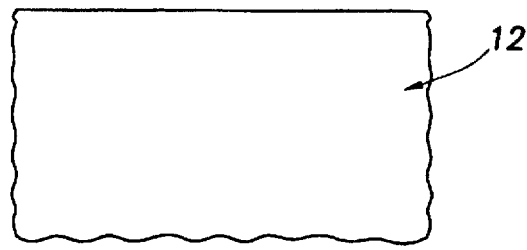
FIG. 2 is a cross-sectional view of the silicon substrate after removal of the sacrificial pre-oxide layer according to a conventional removal methodology.

The pre-process growth of oxide layer 10 may be carried out at a temperature of between 1000° C. and 1150° C., and may also serve as the high-temperature oxygen denudation step in the Cz bulk silicon wafer intrinsic gettering process described above. Oxide layer 10 may then be removed in order to eliminate surface defects. FIG. 2 shows silicon substrate 12 after removal of thermally grown oxide layer 10.

Figure 5:
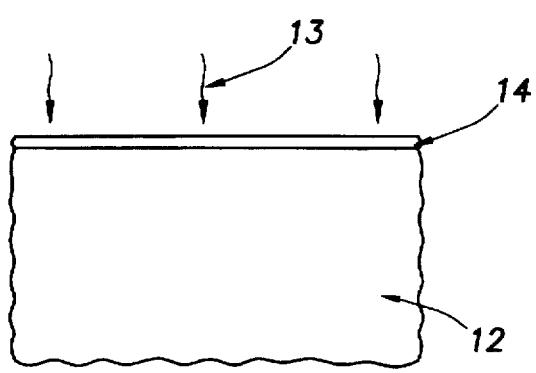
FIG. 5 is a cross-sectional view of the silicon substrate with a pad oxide layer formed upon the silicon substrate similar to FIG. 3 except performed according to an alternative NMOS process flow.
Figure 6:
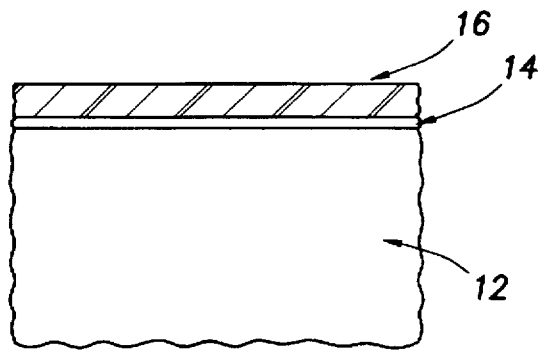
FIG. 6 is a cross-sectional view of the silicon substrate with a nitride layer placed upon the pad oxide layer of FIG. 5.

If a pad oxide and nitride masking layer is to be used, a third step in an NMOS wafer fabrication process may be the growth of a pad oxide on the silicon substrate. FIG. 5 shows a pad oxide layer 14 on silicon substrate 12. Thermal energy 13 may be used to grow pad oxide layer 14, or pad oxide layer 14 may be deposited using a chemical vapor deposition (CVD) process. The function of pad oxide layer 14 is to cushion the transition of stresses between silicon substrate 12 and the nitride layer to be deposited next. After pad oxide layer 14 is grown on silicon substrate 12, a nitride layer 16 may be CVD deposited over the pad oxide layer. FIG. 6 shows silicon substrate 12 with pad oxide layer 14 and a nitride layer 16. The deposition of nitride layer 16 may be carried out at a temperature of about 780° C., which may serve as the reduced-temperature oxygen nucleation step in the Cz bulk silicon wafer intrinsic gettering process described above.

Up to this point, the steps in the NMOS process up to that shown in FIG. 5 are substantially identical to the CMOS process steps ending in FIG. 3. The well definition and alignment mark (step) formations of the CMOS n-well process are purposefully not present in the NMOS process.

The next step in the NMOS process continues directly into the standard LOCOS procedure. LOCOS procedure in an NMOS process sequence begins by the deposition of nitride layer 16 over pad oxide 14 shown in FIG. 6. Nitride is generally carried out at a temperature of about 780° C., which serves as the reduced-temperature oxygen nucleation step in the Cz bulk silicon wafer intrinsic gettering process described above.

The nitride and underlying pad oxide layers are then selectively etched as shown in FIG. 7b to form windows to exposed substrate which will define the active regions. The patterned nitride layers are shown as reference numerals 34c and 34d, and the underlying patterned pad oxide layers are denoted as 32c and 32d. A thick field oxide is thereafter grown on silicon substrate 12 in areas absent nitride. Field oxide is typically grown at a temperature of about 1050° C., and may also serve as the high-temperature oxygen precipitation step in the Cz bulk silicon wafer intrinsic gettering process described above. After the field oxide regions are grown, the pad oxide-nitride layers covering the active regions are then removed. FIG. 7b illustrates a NMOS fabrication sequence prior to field oxide formation and prior to the next step of exposing the active regions by removing the remaining, patterned nitride. Similar to CMOS process, NMOS sequence continues with various steps subsequent to LOCOS, all of which are known to one skilled in the art and described in Wolf, et al., "Silicon Processing for the VLSI Era," Vol. 2, pp. 327–337 (incorporated herein by reference).

Figure 12:
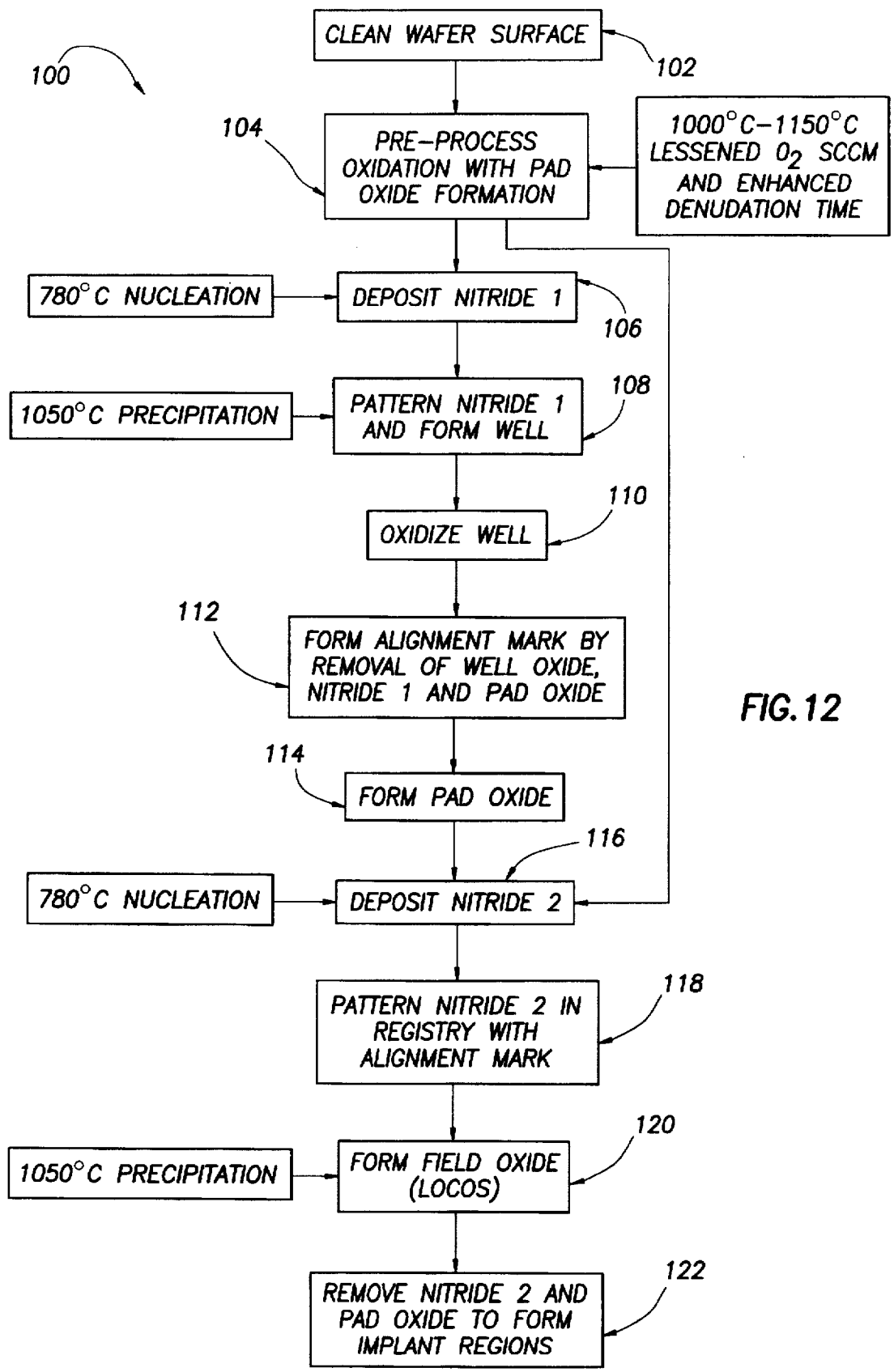
FIG. 12 is a flow diagram of a method of fabricating a CMOS device and/or an NMOS device on a silicon substrate according to the present invention.

FIG. 12 is a flow diagram of the present fabrication process set forth in alternative (CMOS and/or NMOS) embodiments illustrated in the CMOS flow of FIGS. 3, 4, 7a, 8a, 9a and 10a, and in the NMOS flow of FIGS. 5, 6 and 7b. FIG. 12 illustrates the elimination of a pre-oxide (sacrificial pre-oxide step) and replacing the benefits of a pre-oxide step with pad oxide 14. Replacement of pre-oxide occurs in either a CMOS flow or an NMOS flow.

The present process flow beings by preparing a clean wafer. The wafer is cleaned according to step 102 by any suitable wet solution, such as a RCA solution and methodology described hereinabove. After the wafer is cleaned, it undergoes a pre-process oxidation step necessary to form pad oxide 14. Pad oxide 14 is formed in lieu of a step known in the conventional art as a pre-oxide step described above in reference to FIGS. 1 and 2. Instead of forming a pre-oxide layer, the form and function of the pre-oxide layer with gettering advantages is performed entirely with a pad oxide 14. Instead of growing a pre-oxide, removing the pre-oxide and thereafter growing a pad oxide, the present process simply eliminates the former two steps in favor of the latter step of pad oxide formation. Pad oxide serves the same function as the pre-oxide, yet need not, in a single step, be eliminated in its entirety. A result being a substantial reduction in the number of required operations in CMOS and NMOS wafer fabrication steps. Thus a pre-process oxidation, serving as pad oxide 14, constitutes step 104 in either a CMOS or NMOS process flow.

FIG. 3 shows a pad oxide layer 14 on a silicon substrate 12. In this case, thermal energy 13 may be used to grow pad oxide layer 14 with a thickness of between 250 and 400 angstroms. As mentioned above, silicon atoms at the surface of the silicon substrate are consumed as an oxide layer grows on a silicon substrate, and the oxide-silicon interface moves into the silicon substrate. Defects on and just under the surface of silicon substrate 12 may thus be eliminated during pad oxide growth and removal operations. The function of pad oxide layer 14 is to cushion the transition of stresses between silicon substrate 12 and the nitride layer to be deposited next.

Pre-process oxidation with pad oxide formation step 104 may be carried out at a temperature of between 1000° C. and 1150° C., over a period of one to four hours, in a dry atmosphere (i.e., in the absence of moisture), and in the presence of oxygen gas flowing at a rate of less than 400 sccm. Thus in both CMOS and NMOS processes, pre-process oxidation with pad oxide formation step 104 may also serve as the high-temperature oxygen denudation step in the Cz bulk silicon wafer intrinsic gettering process described above.

Step 106 is next step in a CMOS process. This step is not included in an NMOS process. An NMOS process continues with a deposit nitride 2 (defined as a second nitride) step 116 as described below.

During step 106 in which nitride 1 (defined as a first nitride) is deposited, the nitride layer is formed over the pad oxide layer. FIG. 4 shows silicon substrate 12 with pad oxide layer 14 and an overlying first nitride layer 16. The function of nitride layer 16 is to inhibit further oxidation of the underlying silicon during a following oxidizing step as described above. Nitride layer 16 may be deposited using a CVD process.

Deposit nitride 1 step 106 may be carried out at a temperature of about 780° C. and in an atmosphere of nitrogen-bearing reactant gas. In a CMOS process, deposit nitride 1 step 106 may also serve as the reduced-temperature oxygen nucleation step in the Cz bulk silicon wafer intrinsic gettering process described above.

A pattern nitride 1 and form well step 108 is the next step in a CMOS process. The pad oxide-nitride layer may be masked and etched to form windows which will define the well regions. A layer of photoresist may be applied to the surface of the entire silicon substrate and patterned using optical lithography techniques. The nitride layer may then be dry etched, and the pad oxide may be removed using a wet or dry chemical etch process. The photoresist may be left in place to serve as an additional masking layer during impurity implant.

After the well regions are defined and the pad oxide-nitride layer etched, well implants may be formed. Dopant impurities made be introduced into a silicon substrate by chemical diffusion or ion implantation. In an CMOS well process, a p+ implant of boron or phosphorus is typically used. FIG. 7a shows silicon substrate 12 with etched pad oxide layer 14, first nitride layer 16, photoresist layer 18, and incident dopant atoms 20 forming a well implant 22. After well implant 22 has been formed, photoresist layer 18 may be stripped. Silicon substrate 12 may then be subjected to a high temperature drive-in (following chemical diffusion doping) or anneal (following ion implantation).

The drive-in or anneal of well implant 22 during pattern nitride 1 and form well step 108 may be carried out at a temperature of about 1050° C. For a CMOS process, pattern nitride 1 and form well step 108 may also serve as the high-temperature oxygen precipitation step in the Cz bulk silicon wafer intrinsic gettering process described above.

An oxidize well step 110 may be the next step in a CMOS process. In order to form alignment marks (steps) in the surface topography of silicon substrate 12, a thick oxide layer may be grown over the well regions. This thick oxide layer may be grown by means of wet oxidation (at an elevated temperature and in an atmosphere containing water vapor). As mentioned above, an oxide layer consumes silicon atoms at the surface of a silicon substrate as it grows. Thus the oxide-silicon interface moves into the silicon substrate as the oxide layer grows. The thick oxide layer grows where there is no masking nitride, and may merge into the exposed edges of the pad oxide layer. FIG. 8a shows silicon substrate 12, pad oxide layer 14 merged with thick oxide layer 24, nitride layer 16, and n-well implant 22.

An alignment mark is formed by removal of well oxide, nitride 1, and pad oxide step 112 is the next step in a CMOS process. Thick oxide layer 24 over the well regions may be etched away using a wet or dry chemical process. Nitride layer 16 may be dry etched, and pad oxide layer 14 may be etched by a wet or dry chemical process. FIG. 9a shows an alignment mark (step) 26 formed in the surface topography of silicon substrate 12 by the growth and removal of thick oxide layer 24.

An alignment mark may also be created in a test die area of a silicon substrate. Test die areas typically contain special devices and circuit elements that can be electrically tested during the wafer fabrication process. The layer of photoresist applied to the entire surface of the wafer during the previous n-well definition process may be patterned to leave a window in the photoresist over the alignment mark area. The nitride layer over the alignment mark area may then be removed during the subsequent dry etch step, and the pad oxide over the alignment mark area may be removed during the wet or dry chemical etch process. A thick oxide layer may also be grown over the alignment mark area at the same time the thick oxide layer is grown over the n-well regions. The thick oxide over the alignment mark area may then be removed when the thick oxide layer over the n-well regions is removed. A step will thus be created in the surface of the silicon substrate around the periphery of the alignment mark. FIG. 11 shows one embodiment of an alignment mark 30 in test die area 28 of silicon substrate 12.

A form pad oxide step 114 may be the next step in a CMOS process. A pad oxide layer may be grown over the active regions to cushion the transition of stresses between the silicon substrate and the nitride layer to be deposited next. The pad oxide layer may be thermally grown or deposited using a chemical vapor deposition (CVD) process.

A deposit nitride 2 step 116 may be the next step in a CMOS process, and an NMOS process resumes from pre-process oxidation with pad oxide formation step 104. A nitride layer may be deposited over a pad oxide layer to inhibit further oxidation of the underlying silicon during a following oxidizing step.

Deposit nitride 2 step 116 may be carried out at a temperature of about 780° C. For an NMOS process, deposit nitride 2 step 116 may also serve as the reduced-temperature oxygen nucleation step in the Cz bulk silicon intrinsic gettering process.

A pattern nitride 2 in registry with alignment mark step 118 may be the next step in a CMOS or NMOS process. The pad oxide-nitride layer may be masked and etched to form windows which will define the active regions. A layer of photoresist may be applied and patterned using optical lithography. The mask used during optical lithography may be aligned using the alignment marks (steps) created during form alignment mark by removal of well oxide, nitride 1, and pad oxide step 112. The nitride layer may then be dry etched, and the pad oxide removed using a wet or dry chemical etch process.

For a CMOS n-well process, FIG. 10a shows silicon substrate 12 with n-well implant 22 and second nitride layer selectively removed to form regions 34a and 34b on pad oxide layers 32a and 32b, respectively. For an NMOS process, FIG. 7b shows silicon substrate 12 with second nitride layer selectively removed to form regions 34c and 34d on pad oxide layers 32c and 32d, respectively.

A form field oxide (LOCOS) step 120 is the next step in a CMOS or NMOS process. A thick oxide layer may be grown by means of wet oxidation (at an elevated temperature and in an atmosphere containing water vapor) in a LOCOS device isolation procedure.

Form field oxide (LOCOS) step 120 may be carried out at a temperature of about 1050° C. For an NMOS process, form field oxide (LOCOS) step 120 may also serve as the high-temperature oxygen precipitation step in the Cz bulk silicon wafer intrinsic gettering process described above.

A remove nitride 2 and pad oxide to form implant regions step 122 is the next step in a CMOS n-well or NMOS process. A nitride layer over a pad oxide layer may be dry etched, and the underlying pad oxide layer may be removed using a wet or dry chemical etch process.

FIG. 10a applies to a CMOS n-well process. Nitride layers 34a and 34b over pad oxide layers 32a and 32b may be dry etched, and the underlying pad oxide layers 32a and 32b may be removed using a wet or dry chemical etch process.

FIG. 7b applies to an NMOS process. Nitride layers 34c and 34d over pad oxide layers 32c and 32d may be dry etched, and the underlying pad oxide layers 32c and 32d may be removed using a wet or dry chemical etch process. A CMOS process or NMOS process continues according to well known steps customized to various process flows suitable to numerous integrated circuit manufacturers.

The above improved method of manufacturing integrated circuits using CMOS and NMOS processes has fewer manufacturing steps than typical manufacturing processes. The improved processes as described above combine sacrificial oxide growth and removal steps with existing pad oxide growth and removal steps, resulting in CMOS and NMOS processes with fewer steps. A wafer fabrication process with fewer steps logically results in a decrease in the amount of time and effort required to process wafer lots, thus decreasing costs incurred and increasing manufacturing throughput. The thermal cycles required to form gettering sites within Cz bulk silicon wafers are retained, thus allowing the number of required processing operations to be reduced without negatively impacting levels of expected manufacturing yields.

Numerous variations and modifications will become apparent to those skilled in the art once the above disclosure is fully appreciated. It is intended that the following claims be interpreted to embrace all such variations and modifications.

What is claimed is:

1. A method for producing a semiconductor topography, comprising:

providing a single crystal silicon material having an exposed surface;

growing a pad oxide upon said exposed surface after the exposed surface is subjected to a cleaning solution, wherein the growth of said pad oxide encompasses a denudation step within an intrinsic gettering processing, and wherein said denudation step occurs concurrent with said growing;

depositing a nitride film upon said pad oxide, wherein the deposition of said nitride film encompasses a nucleation step within an intrinsic gettering process, and wherein said nucleation step occurs concurrent with said depositing;

patterning said nitride film and underlying pad oxide to present an opening to said exposed surface;

introducing dopant impurities into said single crystal silicon material through said opening to said exposed surface of said single crystal silicon material, wherein the introduction of said dopant impurities encompasses a precipitation step within an intrinsic gettering process, and wherein said precipitation step occurs concurrent with said introducing;

growing a sacrificial oxide upon said exposed surface within the confines of said opening and thereafter removing said sacrificial oxide to present an elevational recess about the lateral periphery of said opening; and using said elevational recess to align a mask subsequently placed in proximity with said exposed surface.

2. The method as recited in claim 1, wherein said providing step comprises slicing into wafers an ingot of said single crystal silicon, wherein said exposed surface is a planar surface of said wafer.

3. The method as recited in claim 1, further comprising:

removing the remaining portion of said nitride film and underlying pad oxide, after the sacrificial oxide has been removed, to present a partially recessed exposed surface;

growing a second pad oxide upon the partially recessed exposed surface and thereafter depositing a second nitride film upon the second pad oxide;

removing portions of said second nitride film and underlying said second pad oxide to present an opening to said partially recessed exposed surface; and growing a field oxide upon said partially recessed exposed surface within the confines of said opening.

4. The method as recited in claim 3, further comprising removing the remaining portion of said second nitride film and said second pad oxide after said field oxide is grown to present an active area of said partially recessed exposed surface into which an ion species is thereafter implanted.

5. The method as recited in claim 1, wherein said sacrificial oxide is configured over a well portion of said single crystal silicon material.

6. The method as recited in claim 1, wherein said sacrificial oxide is greater than 1500 angstroms in thickness and said pad oxide is between 200 to 400 angstroms in thickness.

7. The method as recited in claim 1, wherein the denudation step comprises subjecting the single crystal silicon material, in the absence of moisture, to an oxygen flow less than approximately 400 sccm at a temperature between 1000° C. and 1150° C. for one to four hours.

8. The method as recited in claim 1, wherein the nucleation step comprises placing the pad oxide-covered exposed surface within a chemical vapor deposition chamber, heating to a temperature of approximately 780° C., and adsorbing a nitrogen-bearing reactant gas upon the pad-oxide covered exposed surface.

9. The method as recited in claim 1, wherein the precipitation step comprises introducing the dopant impurities by chemical diffusion into the single crystal silicon material and subsequently subjecting the single crystal silicon material to a drive-in at a temperature of approximately 1050° C.

10. The method as recited in claim 1, wherein the precipitation step comprises introducing the dopant impurities by ion implantation into the single crystal silicon material and subsequently subjecting the single crystal silicon material to an anneal at a temperature of approximately 1050° C.

* * * * *